(12) United States Patent
Fornage

(10) Patent No.: US 9,801,293 B2
(45) Date of Patent: Oct. 24, 2017

(54) ENERGY STORAGE/DELIVERY DEVICE MOUNTING PLATE

(71) Applicant: Enphase Energy, Inc., Petaluma, CA (US)

(72) Inventor: Martin Fornage, Petaluma, CA (US)

(73) Assignee: Enphase Energy, Inc., Petaluma, CA (US)

(*) Notice: Subject to any disclaimer, the term of this patent is extended or adjusted under 35 U.S.C. 154(b) by 0 days.

(21) Appl. No.: 14/918,121

(22) Filed: Oct. 20, 2015

(65) Prior Publication Data
US 2016/0113132 A1 Apr. 21, 2016

Related U.S. Application Data

(60) Provisional application No. 62/066,147, filed on Oct. 20, 2014.

(51) Int. Cl.
H05K 7/02 (2006.01)
H05K 7/04 (2006.01)
H05K 5/02 (2006.01)
H02G 3/10 (2006.01)

(52) U.S. Cl.
CPC ........... *H05K 5/0204* (2013.01); *H02G 3/105* (2013.01)

(58) Field of Classification Search
CPC ........... H05K 3/301; H05K 7/06; H05K 7/142
USPC .......................... 361/801, 803, 807, 809, 810
See application file for complete search history.

(56) References Cited

U.S. PATENT DOCUMENTS

| 4,317,497 | A |   | 3/1982  | Alt et al. |            |
|-----------|---|---|---------|------------|------------|
| 4,716,352 | A | * | 12/1987 | Hurn       | H02J 7/0042 |
|           |   |   |         |            | 320/110    |
| 4,739,242 | A | * | 4/1988  | McCarty    | H02J 7/0013 |
|           |   |   |         |            | 30/DIG. 1  |
| 5,369,565 | A | * | 11/1994 | Chen       | H02J 7/0042 |
|           |   |   |         |            | 224/902    |
| 5,616,968 | A | * | 4/1997  | Fujii      | H02J 3/38  |
|           |   |   |         |            | 307/150    |
| 5,900,715 | A | * | 5/1999  | Roberts    | H01M 10/46 |
|           |   |   |         |            | 320/115    |
| 5,963,014 | A | * | 10/1999 | Chen       | H02J 7/0027 |
|           |   |   |         |            | 320/110    |
| 6,204,632 | B1| * | 3/2001  | Nierescher | H02J 7/0013 |
|           |   |   |         |            | 320/106    |
| 6,593,723 | B1|   | 7/2003  | Johnson    |            |

(Continued)

FOREIGN PATENT DOCUMENTS

KR 20130137483 A 12/2013

OTHER PUBLICATIONS

International Search Report and Written Opinion mailed Jan. 28, 2016 for PCT Application No. PCT/US2015/056455.

*Primary Examiner* — Hung S Bui
(74) *Attorney, Agent, or Firm* — Moser Taboada

(57) ABSTRACT

A system and apparatus for energy storage/delivery device mounting. In one embodiment, the apparatus comprises a mounting plate comprising (i) a plurality of plate mounting features for securing the mounting plate to at least one structure; (ii) a plurality of spatial alignment features for spatially aligning the mounting plate with a second mounting plate; and (iii) at least one energy storage/delivery device mounting feature for mating with a corresponding feature of the energy storage/delivery device to removably mount the energy storage/delivery device on the mounting plate.

20 Claims, 4 Drawing Sheets

(56) References Cited

U.S. PATENT DOCUMENTS

| | | | |
|---|---|---|---|
| 6,935,883 B2 * | 8/2005 | Oddsen, Jr. | H01R 13/625 |
| | | | 248/274.1 |
| 2006/0208697 A1 * | 9/2006 | Chan | H02J 7/0027 |
| | | | 320/116 |
| 2012/0196168 A1 | 8/2012 | Hirsch et al. | |
| 2013/0059477 A1 | 3/2013 | Lavender | |

* cited by examiner

ENERGY STORAGE/DELIVERY DEVICE MOUNTING PLATE

CROSS-REFERENCE TO RELATED APPLICATION

This application claims priority to U.S. Provisional Patent Application No. 62/066,147 filed on Oct. 20, 2014, entitled "AC Battery Mounting Plate", which is herein incorporated in its entirety by reference.

BACKGROUND OF THE INVENTION

Field of the Invention

Embodiments of the present disclosure generally relate to mounting structures for power devices, and, more particularly, to an apparatus for mounting an energy storage/delivery device.

Description of the Related Art

As use of distributed generators (DGs) for generating energy from renewable sources becomes more popular, interest in distributed energy storage (e.g., home energy storage) is increasing. Such energy storage systems can benefit users by providing more control over how and when they obtain the power they need, as well as helping utilities by shifting demand to off-peak hours and smoothing out the load on the system.

Some distributed energy storage devices both store generated energy and can also deliver the stored energy as DC or AC power via a power converter or inverter. One such energy storage/delivery device is an AC battery. AC batteries and other types of energy storage/delivery devices may be mounted on a structure such as a wall inside or outside of a home. Mounting these devices is generally tedious and labor intensive, for example requiring a user to locate multiple framing studs behind a wall in order to securely affix a plurality of energy storage/delivery devices.

Therefore, there is a need in the art for an apparatus for efficiently mounting one or more energy storage/delivery devices.

SUMMARY OF THE INVENTION

Embodiments of the present invention generally relate to an apparatus for mounting an energy storage/delivery device as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
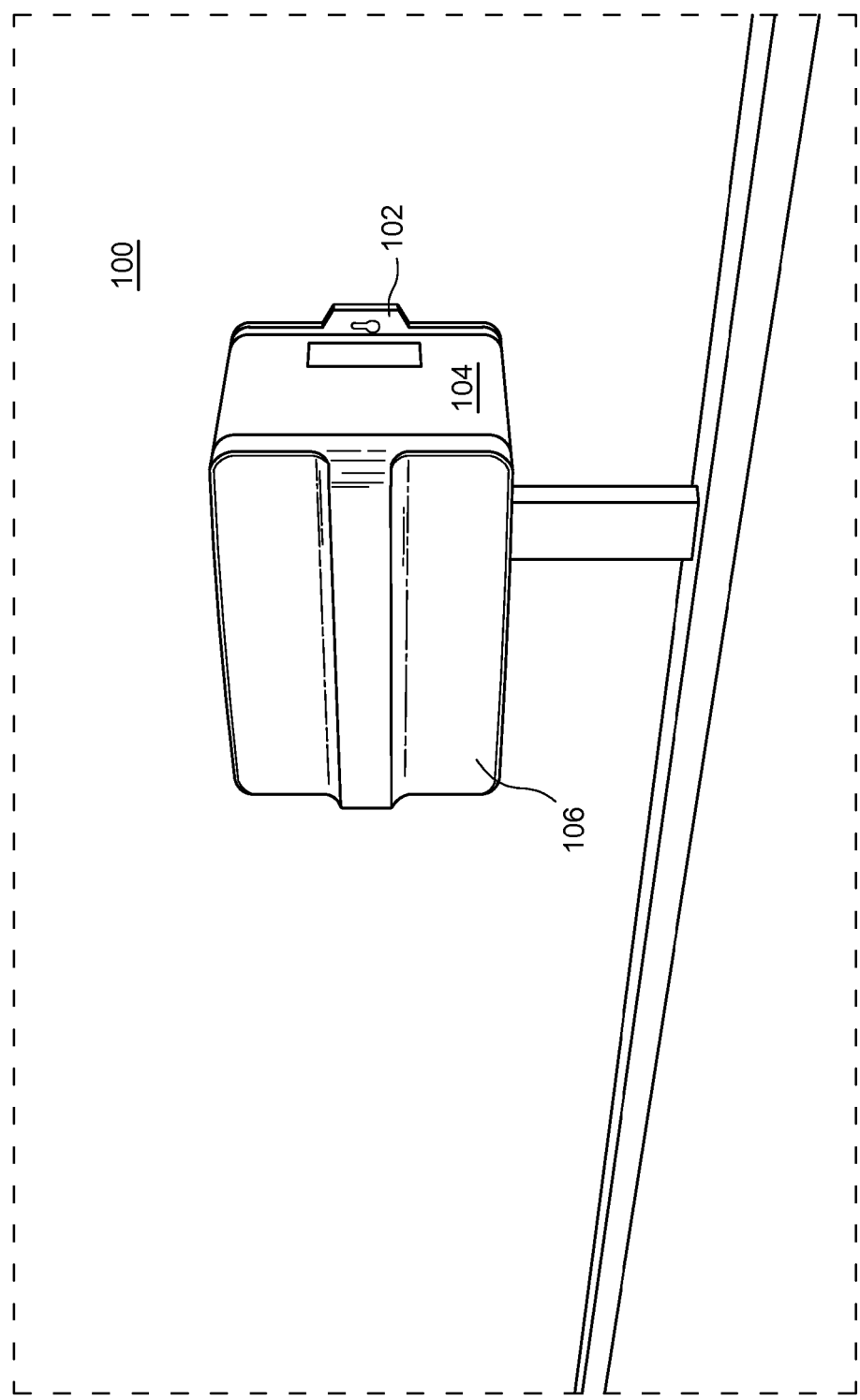
FIG. 1 is a front angled perspective view of an AC battery mounting assembly in accordance with one or more embodiments of the present invention.

FIG. 1 is a front angled perspective view of an AC battery mounting assembly 100 in accordance with one or more embodiments of the present invention. The AC battery mounting assembly 100 comprises an AC battery unit 104 (i.e., an energy storage/delivery device 104) mounted upon an AC battery mounting plate 102 (which may also be referred to as "mounting plate 102"). The AC battery unit 104 comprises an AC battery housing 106 that encases an "AC battery" (not shown). The AC battery comprises at least one energy storage device (such as a battery) coupled to at least one power inverter that receives AC power and converts the AC power to a DC output that is stored in the at least one energy storage device. The AC battery may further deliver stored energy by converting it into an AC output that may be coupled, for example, to an AC power grid via a power connection point such as a load center, a fuse box, a splice box, or the like. One example of an AC battery may be found in commonly assigned, co-pending U.S. patent application Ser. No. 14/841,010, entitled "Parallel Power Converter" and filed Aug. 31, 2015, which is herein incorporated in its entirety by reference.

As described in detail below, the AC battery mounting plate 102 is sized and shaped to accommodate screws spaced for securing the mounting plate 102 to vertical wall studs. The AC battery mounting plate 102 also has one or more interlocking edge elements to easily align neighboring mounting plates 102 and to allow opposite ends of neighboring mounting plates 102 to be secured to the same stud. In one or more embodiments, the AC battery housing 106 has a flange or hook that slides into a corresponding slot or flange of the mounting plate 102 for easily mounting the AC battery unit 104 to the mounting plate 102.

In one or more alternative embodiments, the mounting plate 102 may mount other devices such as other types of energy storage and delivery devices 104 (e.g., a DC battery that receives a DC input, stores the received energy, and subsequently delivers a DC output from the stored energy).

Figure 2:
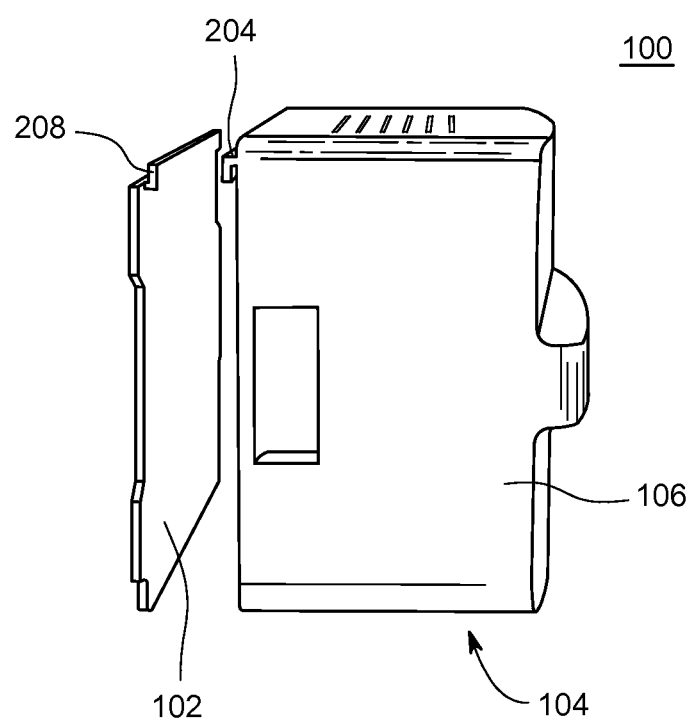
FIG. 2 is an exploded side perspective view of an AC battery mounting assembly in accordance with one or more embodiments of the present invention.

FIG. 2 is an exploded side perspective view of an AC battery mounting assembly 100 in accordance with one or more embodiments of the present invention. In the embodiment depicted in FIG. 2, the mounting plate 102 comprises a mounting plate flange 208, such as a hook or a lip, disposed horizontally along the top edge of the mounting plate 102. The mounting plate flange 208 is a battery mounting feature that is suitably sized and shaped to mate with a corresponding AC battery flange 204 disposed along the top of the rear of the AC battery unit 104 in order to removably mount the AC battery unit 104 upon the mounting plate 102. As depicted in FIG. 2, the mounting plate flange 208 may be shorter than the width of the mounting plate 102; alternatively, the mounting plate flange 208 may run along the entire width of the mounting plate 102. In other embodiments, the mounting plate 102 may additionally or alternatively comprise one or more other battery mounting features, such as flanges, lips, hooks, cavities, and the like, for mating with a corresponding battery mounting feature of the AC battery unit 104 to mechanically and removably mount the AC battery unit 104.

Figure 3:
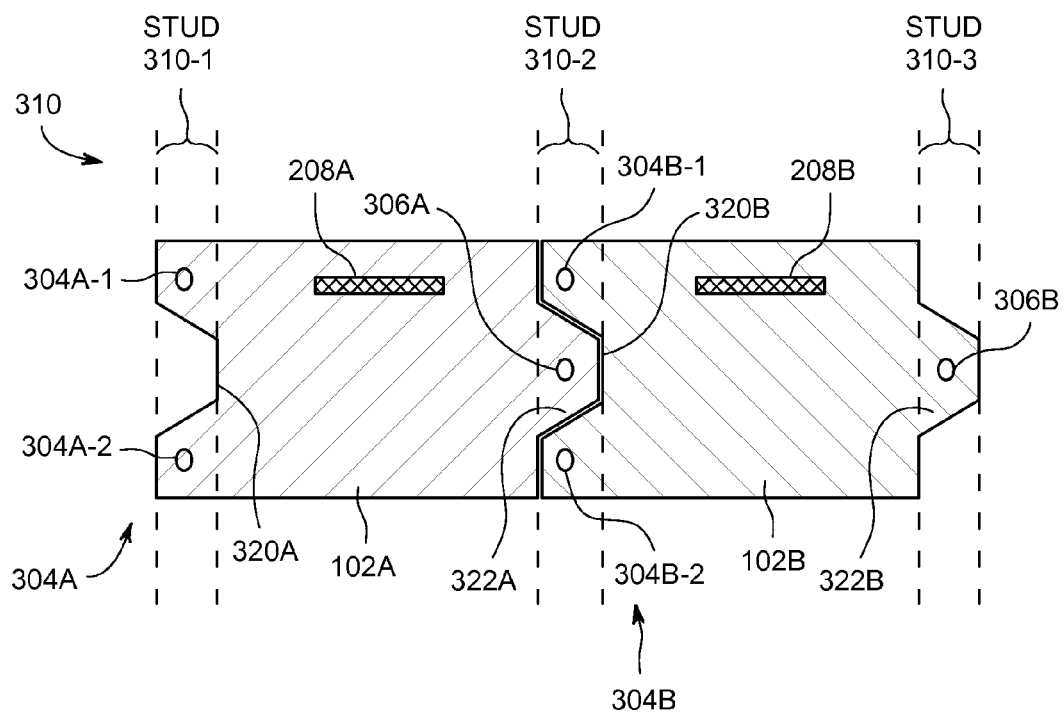
FIG. 3 is a front perspective view of two mounted AC battery mounting plates and in accordance with one or more embodiments of the present invention.

FIG. 3 is a front perspective view of two mounted AC battery mounting plates 102A and 102B in accordance with one or more embodiments of the present invention.

The mounting plates 102A and 102B, collectively referred to as mounting plates 102), are secured to adjacent wall studs 310-1, 310-2, and 310-3 (shown in phantom) and are each generally rectangular-shaped and formed from a rigid material such as rigid plastic, metal, ceramic, or similar material. The size of each mounting plate is such that it can support a corresponding energy storage/delivery device 104.

Each mounting plate 102A and 102B defines an indent 320A and 320B, respectively, (e.g., a groove) along a first vertical edge and further defines substantially vertically aligned fastener holes 304A-1/304A-2 and 304B-1/304B-2, respectively, straddling the respective indent 320A and 320B (i.e., one hole above and one hole below the indent 320). Each mounting plate 102A and 102B further comprises a protrusion 322A and 322B, respectively, (e.g., a tongue) along the second vertical edge (i.e., on the vertical edge opposite to the indent 320), and a fastener hole 306A and 306B is defined within the corresponding protrusion area. The indent 320 and the protrusion 322 are spatial alignment features having complementary shapes that interlock in a tongue and groove manner when the vertical edges of adjacent mounting plates 102 are butted against one another; as such, adjacent mounting plates 102 can be easily horizontally aligned for installation.

The fastener holes 304 and 306 are plate mounting features for securing the mounting plate 102 to a structure from mounting the AC battery unit 104. In the embodiment depicted in FIG. 3, the fastener holes 304-1 and 306 are keyhole fittings that enable the mounting plate 102 to be easily mounted to/removed from a surface. The horizontal distance between the fastener holes 104 and 106 is on the order of the standard spacing between adjacent wall studs, such as 16 inches in some embodiments or 24 inches in other embodiments. When the protrusion 322 of a first mounting plate 102 is interlocked with the indent 320 of a second mounting plate 102, the fastener hole 306 of the first mounting plate and the fastener holes 304 of the second mounting plate 102 are substantially vertically aligned, e.g., within a threshold less than the width of a standard wall stud. As such, installation of multiple mounting plates 102 is greatly simplified; after a first wall stud location is identified and a mounting plate 102 is secured to the stud via the fastener holes 304, the indent 320 and the protrusion 322 alignment features enable subsequently added mounting plates 102 to be automatically aligned with adjacent studs when butted against the adjacent mounting plate 102.

As shown in FIG. 3, the mounting plate 102A is secured to the wall stud 310-1 by fasteners (e.g., screws or the like) via the fastener holes 304A-1 and 304A-2, and is further secured to the adjacent wall stud 310-2 via the fastener hole 306A. The mounting plate 102B is secured to the wall stud 310-2 by fasteners (e.g., screws or the like) via the fastener holes 304B-1 and 304B-2, which are substantially vertically aligned (i.e., within the width of the stud 310-2) with the fastener hole 306A. The mounting plate 102B is further secured to the wall stud 310-3 via the fastener hole 306B. In other embodiments, the AC battery mounting plate 102 may have fewer or more fastener holes 304 and 306.

Each of the mounting plates 102 comprises a battery mounting flange 208 (i.e., the mounting plates 102A and 102B comprise the battery mounting flanges 208A and 208B, respectively) as previously described, for mating with corresponding mounting features of AC battery units 104 to mount the AC battery units on the mounting plates 102. In other embodiments, the mounting plates 102 may additionally or alternatively have one or more different mounting features for mounting the AC battery units 104 to the mounting plates 102. For example, the mounting plate 102A may define one or more slots or holes for receiving suitably sized/shaped AC battery box hooks, pegs or protrusions for mounting the AC battery box to the mounting plate 102A.

Although only two mounting plates 102 are depicted in FIG. 3, additional mounting plates 102 may be easily added merely by aligning and interlocking the indents 120 and protrusions 122 of adjacent mounting plates 102.

In some other embodiments, mounting features in addition to or other than fastener holes may be used for securing the mounting plates 102 to the studs 310. For example, in some embodiments the mounting plate 102A may have flanges on the rear of the plate sized and shaped for hooking the mounting plate to screws, hooks, or the like that are secured to the studs 310.

In other embodiments, the mounting plates 102 may have one or more different configurations, such as a different shape; additional and/or different spatial alignment features (e.g., one or more additional horizontal alignment features, one or more vertical alignment features, and the like); additional and/or different plate mounting features (e.g., fewer or more fastener holes, one or more differently shaped fastener holes, one or more differently located fastener holes, or the like); and additional and/or different battery mounting features (e.g., fewer or more flanges, hooks, lips, and the like).

Figure 4:
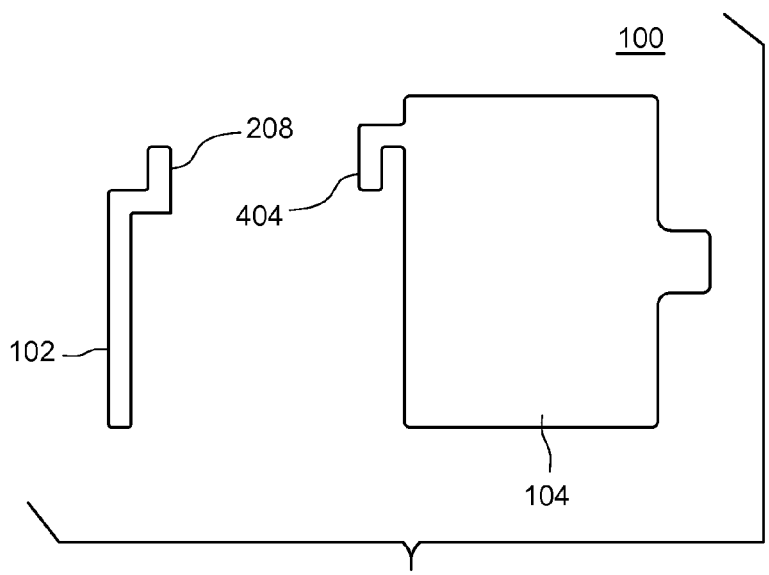
FIG. 4 is an exploded side perspective view of an AC battery mounting assembly comprising a mounting plate and an AC battery unit.

FIG. 4 is an exploded side perspective view of an AC battery mounting assembly 100 comprising a mounting plate 102 and an AC battery unit 104. As previously described, the mounting plate 102 comprises a flange 208, such as a hook or lip, protruding from the front face of the mounting plate 102 (i.e., the face of the mounting plate 102 facing away from the wall or structure onto which the mounting plate 102 is to be secured). The AC battery unit 104 comprises a flange 204, such as a hook or lip, protruding from the rear of the AC battery unit 104. The flanges 208 and 404 may be of any size and/or shape to mate with one another for removably mounting the AC battery unit 104 on the mounting plate 102. For example, in some embodiments the AC battery unit 104 may easily be hung on the mounting plate 102 by sliding the flange 404 of the AC battery unit 104 into the flange 208 of the mounting place 102.

Other embodiments of the AC battery mounting plate 102 and/or the AC battery unit 104 described herein may comprise additional and/or alternative mounting features of different sizes and or shapes that perform the functions shown and/or described herein. For example, the interlocking spatial alignment features of the AC battery mounting plates 102 may be sized and or shaped differently from those described herein while still performing the same function of aligning neighboring mounting plates 102 and their plate mounting features (such as fastener holes) for easy and efficient mounting.

Figure 5:
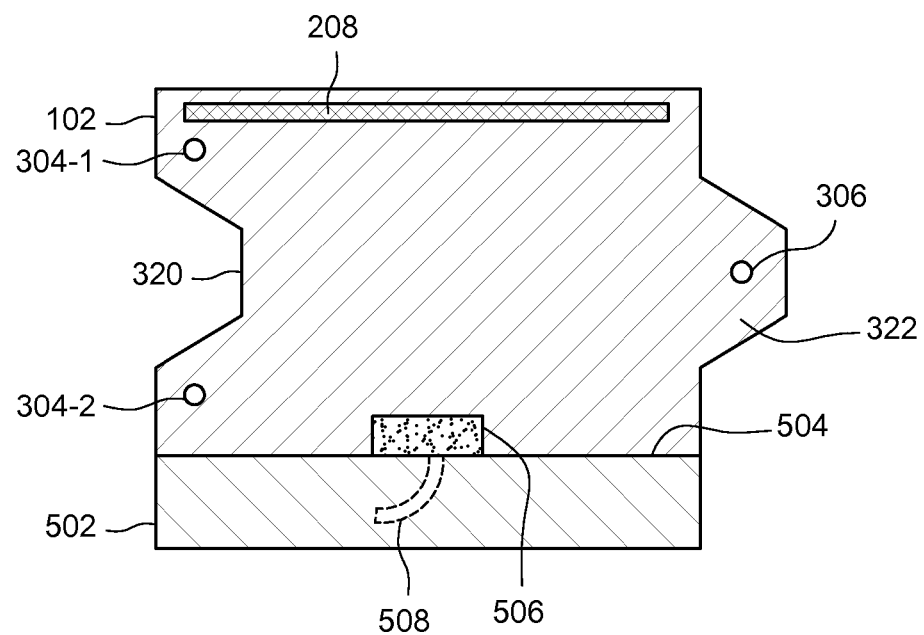
FIG. 5 is a front perspective view of an AC battery mounting plate in accordance with one or more other embodiments of the present invention.

FIG. 5 is a front perspective view of an AC battery mounting plate 102 in accordance with one or more other embodiments of the present invention. As previously described, the AC battery mounting plate 102 comprises the mounting plate flange 208, the fastener holes 304 and 306, the indent 320, and the protrusion 322.

The mounting plate 102 further comprises an integrated electrical wiring gutter 502 running horizontally along the bottom of the mounting plate 102. The gutter 502 is formed from a rigid material such as rigid plastic, metal, ceramic, or similar material. The gutter 502 may be part of the form factor of the mounting plate 102; alternatively, the gutter 502 may be separately formed and affixed to the mounting plate 102 by one or more of mechanical fasteners, adhesives, and the like.

The gutter 502 is suitably sized and shaped to house and protect electrical wiring (e.g., a trunk cable) that couples the mounted AC battery unit 104 to a power connection point, such as a load center, splice box, fuse box, branch circuit, or the like. For those embodiments where multiple AC battery mounting assemblies 100 are mounted side-by-side, the electrical wiring that each of the AC batteries 104 is coupled to runs through the gutters 502 of the mounting plates 102 and ultimately to a power connection point. The gutter 502 may be substantially rectangularly shaped, substantially U-shaped, substantially L-shaped, or similarly shaped for housing electrical wiring. The size of the gutter 502 is such that it can contain the corresponding electrical wiring.

In some embodiments, the gutter 502 may be open on its horizontal ends for wiring ingress/egress. In such embodiments, a removable cap or cover may be used to cover one or both horizontal ends of the gutter 502 as needed, where the cap or cover may have one or more openings or knockouts to allow for wiring ingress/egress. In other embodiments, one or both of the gutter's horizontal ends are closed but have one or more cutouts or knockouts for wiring ingress/egress as needed. Additionally or alternatively, the bottom and/or front of the gutter 502 may have one or more cutouts or knockouts for wiring ingress/egress.

A gutter cover 504 is coupled to the gutter 502, for example running along an open top of the gutter 502, for containing and protecting the electrical wires within the gutter 502. The gutter cover 504 may be completely removable from the gutter 502 or, alternatively, not detachable but movable to allow access to the interior of the gutter 502 (e.g., the gutter cover 504 may be hinged to the gutter 502, may slide open, or similarly allow access to the interior of the gutter 502). When closed, the gutter cover 504 may be mechanically secured to the gutter 502, for example by one or more of snap-fitting, mechanical fasteners, and the like.

An AC connector 506 (i.e., a power connector 506) is mounted to the top of the gutter cover 504 and positioned such that it extends vertically upward from the gutter cover 504 for mating with a corresponding AC connector (i.e., a power interface connector) of the AC battery unit 104 (not shown). In some other embodiments, the AC connector 506 is affixed to or part of the mounting plate 102 and the gutter cover 504 defines a cut-out or knockout for accommodating the AC connector 506. In one or more alternative embodiments where the energy storage/delivery device 104 is a DC device, the power connector 506 is a DC connector for mating with a corresponding DC connector of the energy storage delivery device 104.

The AC connector 506 comprises connector pigtails 508 (shown in phantom) that extend from the AC connector 506 toward the interior of the gutter 502. The connector pigtails 508 are adapted for being coupled to electrical wiring within the gutter 502 (e.g., a trunk cable) for electrically coupling the AC connector 506 to such electrical wiring. In some embodiments, the connector pigtails 508 may be coupled to such electrical wiring by a twist-on wire connector or similar type of connector; in other embodiments, the connector pigtails 508 may terminate in an insulation displacement connector (IDC) for coupling to the electrical wiring within the gutter 502.

Although in FIG. 5 the gutter 502 is depicted as running along the bottom of the mounting plate 102 with the gutter cover 504 running along the top of the gutter 502 and having the AC connector 506 substantially centered, in other embodiments the gutter 502, gutter cover 504, and/or AC connector 506 may be positioned differently. For example, in some embodiments the gutter opening may be in the front of the gutter 502 rather than along the top of the gutter 502; in such embodiments, the AC connector 506 may be mounted to the top of the gutter 502 (or be part of the gutter's form factor) rather than being mounted to the gutter cover 504.

Figure 6:
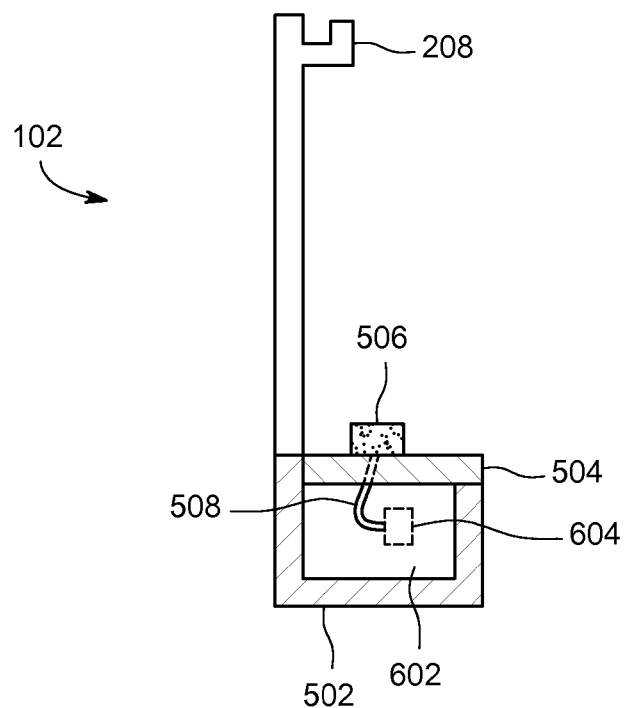
FIG. 6 is a side perspective view of the embodiment of the mounting plate depicted in FIG. 5.

FIG. 6 is a side perspective view of the embodiment of the mounting plate 102 depicted in FIG. 5. As previously described, the mounting plate 102 comprises the mounting plate flange 208 toward the top of the mounting plate 102 and the gutter 502 at the bottom of the mounting plate 102. The gutter cover 504 is positioned atop of the gutter 502 and the AC connector 506 is mounted on the gutter cover 504. The connector pigtails 508 extend into an open interior 602 defined by the gutter 502. In some embodiments, the connector pigtails 508 terminate in an IDC 604 (shown in phantom), such as an IDC terminal splice tap connector.

While the foregoing is directed to embodiments of the present invention, other and further embodiments of the invention may be devised without departing from the basic scope thereof, and the scope thereof is defined by the claims that follow.

The invention claimed is:

1. An apparatus for mounting an energy storage/delivery device, comprising:
a mounting plate comprising (i) a plurality of plate mounting features for securing the mounting plate to at least one structure; (ii) a plurality of spatial alignment features for spatially aligning the mounting plate with a second mounting plate; (iii) at least one energy storage/delivery device mounting feature for mating with a corresponding feature of the energy storage/delivery device to removably mount the energy storage/delivery device on the mounting plate, (iv) a gutter for housing wiring to electrically couple the energy storage/delivery device to a power connection point, and (v) a power connector through which current flows from the power connection point to the energy storage/delivery device and from the energy storage/delivery device to the power connection point.

2. The apparatus of claim 1, wherein the mounting plate is spatially aligned with the second mounting plate such that at least one plate mounting feature of the plurality of plate mounting features is spatially aligned with at least one plate mounting feature of the second mounting plate.

3. The apparatus of claim 2, wherein the at least one plate mounting feature of the plurality of plate mounting features and the at least one plate mounting feature of the second mounting plate are spatially aligned within a threshold amount.

4. The apparatus of claim 3 wherein the at least one plate mounting feature of the plurality of plate mounting features and the at least one plate mounting feature of the second mounting plate are vertically aligned within the threshold amount.

5. The apparatus of claim 4, wherein the threshold amount is less than the width of a framing stud.

6. The apparatus of claim 1, wherein the plurality of spatial alignment features comprises (a) an indent along a first vertical edge of the mounting plate, and (b) a protrusion along a second vertical edge, opposite to the first vertical edge, of the mounting plate, wherein the protrusion has a shape complementary to the indent.

7. The apparatus of claim 1, wherein the plurality of spatial alignment features enable the mounting plate to be horizontally aligned with adjacent mounting plates.

8. The apparatus of claim 1, wherein the at least one energy storage/delivery device mounting feature is a flange.

9. The apparatus of claim 1, further comprising (v) a gutter cover for covering the gutter, and (vi) a power connector, mounted on the gutter cover, for mating with a corresponding power interface connector of the energy storage/delivery device.

10. A system for mounting an energy storage/delivery device, comprising:
   a mounting plate comprising (i) a plurality of plate mounting features for securing the mounting plate to at least one structure; (ii) a plurality of spatial alignment features for spatially aligning the mounting plate with a second mounting plate; (iii) at least one energy storage/delivery device mounting feature, (iv) a gutter for housing wiring to electrically couple the energy storage/delivery device to a power connection point, and (v) a power connector through which current flows from the power connection point to the energy storage/delivery device and from the energy storage/delivery device to the power connection point; and
   the energy storage/delivery device comprising at least one mounting feature for mating with the at least one energy storage/delivery device mounting feature to removably mount the energy storage/delivery device on the mounting plate.

11. The system of claim 10, wherein the mounting plate is spatially aligned with the second mounting plate such that at least one plate mounting feature of the plurality of plate mounting features is spatially aligned with at least one plate mounting feature of the second mounting plate.

12. The system of claim 11, wherein the at least one plate mounting feature of the plurality of plate mounting features and the at least one plate mounting feature of the second mounting plate are spatially aligned within a threshold amount.

13. The system of claim 12 wherein the at least one plate mounting feature of the plurality of plate mounting features and the at least one plate mounting feature of the second mounting plate are vertically aligned within the threshold amount.

14. The system of claim 13, wherein the threshold amount is less than the width of a framing stud.

15. The system of claim 10, wherein the plurality of spatial alignment features comprises (a) an indent along a first vertical edge of the mounting plate, and (b) a protrusion along a second vertical edge, opposite to the first vertical edge, of the mounting plate, wherein the protrusion has a shape complementary to the indent.

16. The system of claim 10, wherein the plurality of spatial alignment features enable the mounting plate to be horizontally aligned with adjacent mounting plates.

17. The system of claim 10, wherein the at least one energy storage/delivery device mounting feature is a flange.

18. The system of claim 10, wherein the at least one mounting feature of the energy storage/delivery device is a flange.

19. The system of claim 10, further comprising (v) a gutter cover for covering the gutter, and (vi) a power connector, mounted on the gutter cover, for mating with a corresponding power interface connector of the energy storage/delivery device.

20. The system of claim 10, wherein the energy storage/delivery device is an AC battery.

* * * * *